United States Patent
Prins et al.

(10) Patent No.: US 8,216,945 B2
(45) Date of Patent: Jul. 10, 2012

(54) WAFER PLANARITY CONTROL BETWEEN PATTERN LEVELS

(75) Inventors: Steven L. Prins, Fairview, TX (US);
Brian K. Kirkpatrick, Allen, TX (US);
Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 12 days.

(21) Appl. No.: 12/757,665

(22) Filed: Apr. 9, 2010

(65) Prior Publication Data

US 2010/0261353 A1 Oct. 14, 2010

Related U.S. Application Data

(60) Provisional application No. 61/167,936, filed on Apr. 9, 2009.

(51) Int. Cl.
*H01L 21/311* (2006.01)
*H01L 21/469* (2006.01)
*H01L 21/31* (2006.01)

(52) U.S. Cl. ............... 438/703; 438/761; 257/E21.482

(58) Field of Classification Search ............. 438/703, 438/761, 459; 257/E21.46, E21.482, E21.485
See application file for complete search history.

(56) References Cited

U.S. PATENT DOCUMENTS

| 5,953,615 | A | 9/1999 | Yu |
| 7,129,174 | B2 * | 10/2006 | Kim et al. ................ 438/692 |
| 2004/0253795 | A1 * | 12/2004 | Martinez et al. ............. 438/459 |
| 2006/0024917 | A1 * | 2/2006 | Henley et al. ................ 438/455 |
| 2006/0123919 | A1 * | 6/2006 | Lovell et al. .................. 73/788 |
| 2007/0037323 | A1 * | 2/2007 | Henley et al. ................ 438/149 |
| 2008/0233661 | A1 * | 9/2008 | Lu et al. ........................ 438/7 |
| 2008/0272097 | A1 | 11/2008 | Bu et al. |
| 2009/0278287 | A1 * | 11/2009 | Wang et al. .................. 264/485 |
| 2009/0309191 | A1 * | 12/2009 | Theuss ......................... 257/618 |
| 2010/0326071 | A1 * | 12/2010 | Gracias et al. ................ 60/527 |

FOREIGN PATENT DOCUMENTS

| JP | 62252937 | 11/1987 |
| KR | 2009007068 | 7/2009 |

* cited by examiner

*Primary Examiner* — Walter L Lindsay, Jr.
(74) *Attorney, Agent, or Firm* — Jacqueline J. Garner; Wade J. Brady, III; Frederick J. Telecky, Jr.

(57) ABSTRACT

A method for controlling the flatness of a wafer between lithography pattern levels. A first lithography step is performed on a topside semiconductor surface of the wafer. Reference curvature information is obtained for the wafer. The reference curvature is other than planar. At least one process step is performed that results in a changed curvature relative to the reference curvature. The changed curvature information is obtained for the wafer. Stress on a bottomside surface of the wafer is modified that reduces a difference between the changed curvature and the reference curvature. A second lithography step is performed on the topside semiconductor surface while the modified stress distribution is present.

18 Claims, 2 Drawing Sheets

WAFER PLANARITY CONTROL BETWEEN PATTERN LEVELS

CROSS REFERENCE TO RELATED APPLICATIONS

This application and the subject matter disclosed herein claims the benefit of Provisional Application Ser. No. 61/167,936 entitled "Method to Optimize Lithography Alignment Through Frontside and Backside Wafer-Level Stress Engineering", filed Apr. 9, 2009, which is herein incorporated by reference in its entirety.

FIELD

Disclosed embodiments relate to integrated circuits (IC) and IC processing, more specifically to methodologies for controlling the curvature of wafers to improve lithographic processing.

BACKGROUND

When processing semiconductor wafers, different process steps have been found to result in changes to the flatness, bow or warpage across the area of the wafer (referred to herein collectively as global wafer "curvature"). These changes in wafer curvature can directly impact photolithographic alignment and focus. When the global wafer curvature changes enough from one stage of the process flow to another, such as the gate pattern to contact pattern, photolithographic alignment can become difficult, or even not possible (e.g., due too large a differential in the depth of focus), and a significant yield loss may result.

Known approaches to controlling global wafer curvature generally involve changing the process(es) that are found to generate the most curvature. For example, in a MOS process flow, the source/drain anneal temperature or time at its peak temperature may be reduced to reduce the magnitude of the curvature induced. However, since the functions of the source/drain anneal functions include dopant activation, such changes can result in degraded device performance, such as an increase in on resistance ($R_{ON}$). For example, $R_{ON}$ is an important performance figure of merit for MOSFET switching devices and is defined as the ohmic resistance that exists between an input pin and an output pin of a MOSFET switch when the switch is closed and passing a signal. A lower $R_{ON}$*Area allows a designer to use a smaller MOSFET to meet ON resistance requirements for a given application, which reduces the area and cost of a power integrated circuit.

SUMMARY

Disclosed embodiments relate to methods for controlling the flatness of wafers between pattern levels that involve stress modification across the wafer area (i.e., globally) that can return the wafer curvature at a later alignment level towards its curvature at an earlier alignment level. Such approaches can be compared to conventional approaches for controlling the flatness of wafers for minimizing alignment problems that simply seek to limit wafer curvature and do so by reducing the high temperature reached or time at the high temperature used in the high temperature anneal(s). As a result, disclosed embodiments allow maintaining the high temperature anneal duration and anneal temperatures to be used in the process despite significant resulting changes in wafer planarity that for conventional processes can result in the photolithographic alignment problems disclosed above, so that alignment problems can be minimized (e.g., alignment error) and device performance maintained.

A first lithography step is applied to a topside semiconductor surface of the wafer. The wafer has a reference curvature other than planar during the first lithography step, such as saddle bowl, or cylindrical shaped. At least one process step is performed that results in a changed curvature to the wafer relative to the reference curvature. A stress is applied to a bottomside surface or topside semiconductor surface of the wafer to provide a modified stress distribution. The modified stress distribution reduces a difference between the changed curvature and the reference curvature. A second lithography step is then performed to the topside semiconductor surface while the modified stress distribution is present.

DETAILED DESCRIPTION

Figure 1:
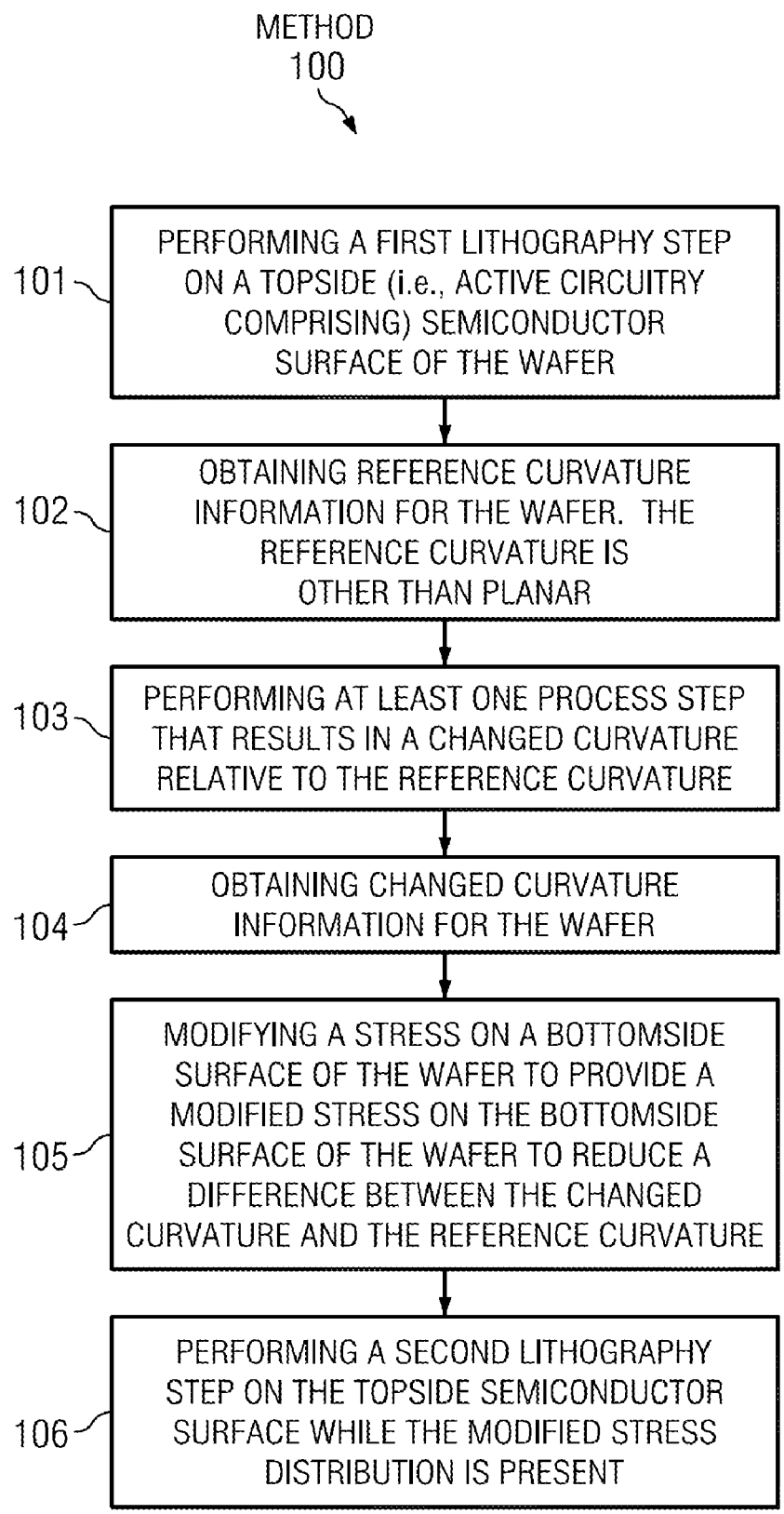
FIG. 1 shows an exemplary method for controlling the flatness between pattern levels of a wafer, according to a disclosed embodiment.

Disclosed embodiments in this Disclosure are described with reference to the attached figures, wherein like reference numerals are used throughout the figures to designate similar or equivalent elements. Several aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Disclosed embodiments relate to methods for controlling the flatness between pattern levels of wafers that involve stress modification to the topside semiconductor surface or the bottomside surface of the wafer. FIG. 1 shows an exemplary method 100 for controlling the flatness of a wafer between lithography pattern levels, according to a disclosed embodiment. In step 101 a first lithography step is performed on a topside (i.e., active circuitry comprising) semiconductor surface of the wafer. The wafer can comprise any substrate used for semiconductor devices, including but not limited to, silicon (Si), SiC, germanium (Ge), Si/Ge, GaAs, GaN, InGaAs, or semiconductor on insulator (SOI). Lithography steps disclosed herein are generally stepper-based lithography processes. However, disclosed embodiments are not limited to stepper-based lithography.

The wafer has a reference curvature during the first lithography step. The reference curvature (e.g., shape, bow or warpage, and its magnitude) during the first lithography step is generally a function of the vacuum applied by the vacuum chuck used by the particular lithography tool, since this vacuum can alter and generally reduce the wafer curvature.

Step 102 comprises obtaining reference curvature information, typically for each wafer, which can be entered into a database that stores curvature information. The reference curvature is other than planar. As known in the art, wafers generally include a machine readable wafer identifier and reference orientation. Depending on the reference curvature data the specific parameters used for method 100 can be customized to reduce the curvature differential between the changed curvature and the reference curvature so that alignment can be improved.

The wafer shape can be various shapes including bowl, saddle or cylindrical shaped, either facing upwards or facing downwards. The reference curvature, can be known a priori, such as from previous measurements or calculations for a particular process flow. Alternatively, the reference curvature can be measured to allow its determination.

The wafer curvature information is generally obtained for each wafer, and can be entered into a database that stores the curvature information by wafer. As known in the art, wafers generally include a machine readable wafer identifier and reference orientation. Depending on the curvature data the specific parameters used, the method can be customized to minimize the curvature following performance of the method. Generally, curvature information is obtained for a plurality of portions for each wafer, such as wafer portions defined by each scanner/stepper shot, or in another embodiment from each individual die. Curvature information for a plurality of portions for each wafer allows the curvature reduction treatment to be different (i.e., customized) across the wafer, such as using different laser anneal parameters across the wafer. In other embodiments, curvature reduction processing may be performed globally (e.g., the recrystallization anneal conditions used are the same die-to-die).

Wafer curvature can be measured directly or indirectly using a variety of methods. One method uses the photolithographic tool to obtain the curvature data. Wafer curvature impacts the location of alignment marks patterned on the wafer. Multiple alignment marks are typically distributed across the exposure field, and therefore the entire surface of the wafer. The relative location of all of these alignment marks can be characterized on the photolithographic tool prior to exposure. This information is used to align the photo mask to existing patterns and is also used to provide a measure of quality of alignment that is expected to be achieved. Alignment mark characterization provides an indirect measure of curvature, because the degree of wafer curvature mismatch between pattern levels requiring alignment with respect to each other can be observed in this alignment mark characterization data.

Wafer curvature can also be quantified using a plurality of other methods. For example, a tool for obtaining wafer curvature data is disclosed in U.S. Pat. Nos. 5,134,303 and 5,248,889. Briefly, devices of the type described in these patents operate by directing a probe beam onto the surface of the wafer. A position sensitive photodetector is then used to measure the location of the reflected probe beam. During calibration, the central portion of the position sensitive photodetector is arranged to coincide with the location where the reflected probe beam would fall (based on Snell's Law) if the wafer surface was flat. Any bow or tilt in the wafer surface will change the direction of the beam, causing a displacement of the reflected probe beam on the photodetector. The amount and direction of the displacement of the reflected probe beam on the detector provides a measure of the direction and extent of the bow or warp of the wafer.

Step 103 comprises performing at least one process step that results in a changed curvature relative to the reference curvature. This process step or series of process steps is generally a sequence of process steps, including at least one deposition and at least one high temperature (e.g., $\geq 850°$ C.) annealing step.

Step 104 comprises obtaining changed curvature information, typically for each wafer, which can be entered into a database that stores the curvature information for wafers, such as a database including the reference curvature. As described above, wafer curvature can be quantified in various ways, such as within a plurality of stepper shot areas on the wafer while the wafer is held under vacuum using the using the indirect curvature measurement provided by the alignment tool. However, as described above, wafer curvature can be quantified using other tools.

Step 105 comprises modifying a stress on a bottomside surface of the wafer to provide a modified stress distribution across an area of the bottom surface of the wafer to reduce a difference between the changed curvature and the reference curvature. Tensile stress or compressive stress can be used. For example, tensile stress applied to the bottomside surface of the wafer can reduce the magnitude of a up-facing bowl shaped wafer, while a compressive applied to the bottomside surface of the wafer can reduce the magnitude of a downward-facing bowl shaped wafer. For a cylindrical shaped wafer, a tensile or compressive stressed film can be used on the bottomside of the wafer deposited in a two step wedge shaped deposition. Between the first and the second wedge shaped deposition the wafer orientation can be rotated 180 degrees. This leaves a compressive or tensile thick film on the wafer edge and thin at the wafer center. A similar concept can be used for saddle shaped wafers but in this case, four wedge shaped depositions are generally used with a pair of compressive wedge shaped films deposited 180 degrees opposite each other and a second pair of tensile wedge shaped films deposited 90 degrees rotated to the previous pair.

The processing at step 105 is generally based on the difference between the changed curvature and the reference curvature, so that the reference wafer curvature information that is typically stored for each wafer as described relative to step 102 is generally useful. The specific processing at step 105 can be provided by an algorithm-based look-up table based on parameters including the wafer diameter, wafer thickness, wafer material, and the reference curvature and the changed curvature.

For example, spacer films (sometimes referred to as sidewall films) are used to space (i.e., spatially offset) ion implants away from the edge of gate stacks in the source/drain area for MOS devices. Nitride films are commonly used for the spacer material and can be deposited using multiple precursors such as silane, di-silane, HCD [hexachlorodisilane] or BTBAS [Bis(tertiary-butylamino)silane]. Most of these films increase in stress in direct proportion to increases in conformality. Thus higher stress levels may be needed to change wafer curvature to gain the improvement in conformality. For example, post topside deposition of compressive (e.g., −200 to −300 MPa) HCD or BTBAS based nitrides, the wafer center is higher than the wafer edge or has an upside down bowl shape. To reduce this curvature, for example, a) a compensating compressive deposition can be added on the wafer's bottomside, b) a portion of a tensile film from the wafer's bottomside can be removed, or c) a compensating tensile film can be added on the wafer topside.

In another example, the curvature of the wafer topside surface may resemble an upwards facing cylinder. This situation can occur in the metal process loops due to the vast majority of the metal lines being oriented in one direction. Any inherent stress in this metal will tend to impart a cylindrical stress state on the wafer.

In one embodiment, the modifying of stress is applied to the bottomside surface of the wafer and is exclusive of depositing a film (i.e., no deposition of an additional film). For example, the modifying stress can comprise thinning a film existing on the bottomside surface of the wafer prior to step 105, or thinning the thickness of the wafer from its bottomside surface (e.g. thinning the substrate from 800 μm to 520 μm). Backside wet etching, backside plasma etching, or backside chemical mechanical polishing (CMP) are exemplary processes can be used for such thinning. The thinning can comprise either uniform thinning or non-uniform thinning. As used herein, non-uniform thinning refers to a thinning process that results in a thickness range across the wafer that is at least 10%.

In the case of backside thinning, non-uniformly thinning can comprises backside wet etching, backside plasma etching, or backside CMP of a film existing on the bottomside surface of the wafer prior to step 105, or the substrate itself. Non-uniform thinning can occur in multiple ways. One exemplary way utilizes an on-axis, bottomside capable, single wafer, wet process tool with suitable etch chemistry. By varying the chemical dispense arm speed, as the wafer rotates beneath the dispense arm, a different amount of film can be removed in a radial pattern. Controlling the removal process to leave more or less of the film at the wafer edge allows wafer curvature to be minimized for bowl shaped surfaces.

Film thickness can generally be varied from 1 to 100% of the original thickness using this method. In another example, non-uniform thinning can be achieved using immersion wet chemistry by lowering the wafer into a wet etch solution reversing direction when the etch solution covers a portion of (e.g. 50%) of the wafer surface. The rate of introduction into the etchant solution can be set to achieve the desired amount of film loss. The wafers can then be re-oriented 180 degrees and the process repeated. In order to use this procedure, the topside surface should generally have a protective coating applied. One exemplary t commonly used protective coating is photoresist.

The modifying stress can also comprise depositing at least one film on the bottomside surface of the wafer. In one embodiment a batch deposition process is used that deposits the film on both sides of the wafer. In another embodiment, a single wafer deposition process is used to deposit a film on the bottomside surface of the wafer only. The modifying stress can comprise non-uniformly thinning of the deposited film to form a non-uniform stress distribution across an area of the bottomside surface of the wafer. As noted above, the non-uniformly thinning of the film can comprise wet etching, plasma etching, or CMP. The non-uniform stress distribution can comprise a radial stress distribution that monotonically increases or decreases in stress beginning from a stress minimum or a stress maximum proximate to the center of the wafer (e.g., within 15 mm of the center). In one embodiment the stress on the bottomside surface is at a minimum proximate to or at the center of said wafer. In another embodiment, the stress on bottomside surface is at a maximum proximate to or at the center of the wafer.

Step 106 comprises performing a second lithography step on the topside semiconductor surface while the modified stress distribution is present. Since the modified stress distribution reduces the difference between the changed curvature and the reference curvature, photolithographic alignment that would otherwise be difficult or even not possible (e.g., due to a difference in depth of focus across respective stepper shots), is provided. For example, the first and second lithography level can be gate pattern and contact pattern, respectively. Disclosed embodiments thus can provide a significant yield increase, either by improving photolithographic alignment (e.g., reduced alignment error) between lithography levels, and/or by allowing the full high temperature anneal duration and anneal temperatures to be used in the process despite significant resulting changes in wafer planarity that for conventional processes which can otherwise result in the photolithographic alignment problems disclosed above, so that device performance can be maintained.

As noted above, in one embodiment the first lithography step comprises a gate pattern and the second lithography step comprises a contact pattern for contacting the topside semiconductor surface of the wafer. However, method 100 can be repeated on the wafer to complete two or more sets of respective lithography steps.

Figure 2:
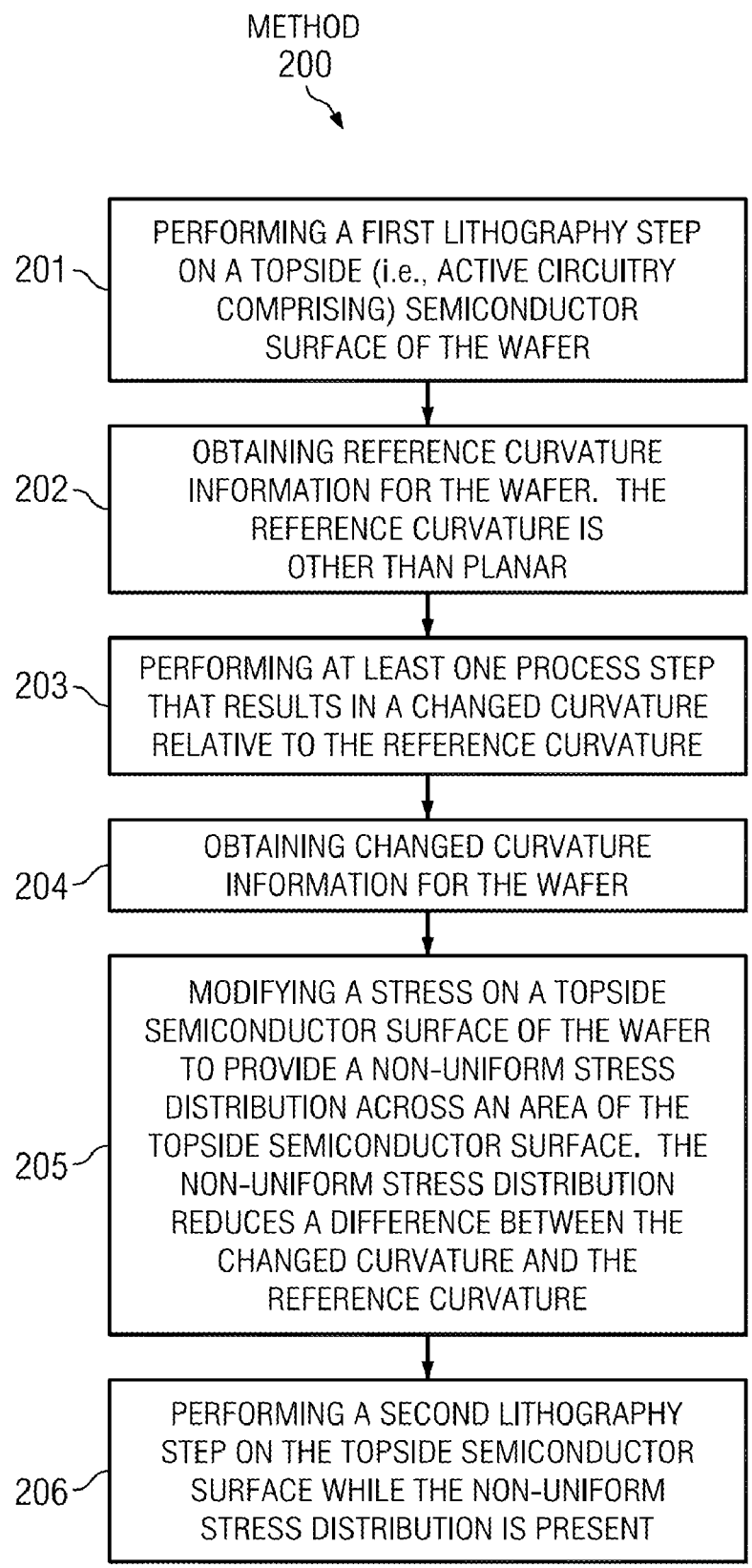
FIG. 2 shows an exemplary method for controlling the flatness between pattern levels of a wafer, according to another disclosed embodiment.

FIG. 2 shows an exemplary method 200 for controlling the flatness of a wafer between pattern levels, according to another disclosed embodiment. Unlike method 100, method 200 involves topside stress compensation. Steps 201-206 track steps 101-106 described above with respect to method 100, except step 205 comprises modifying a stress on a topside semiconductor surface of the wafer to provide a non-uniform stress distribution across an area of the topside semiconductor surface. The non-uniform stress distribution reduces a difference between the changed curvature and the reference curvature. Step 205 follows step 105 described below, except the procedure is performed on the front surface, and the sign of the stress is flipped as would be recognized by one having ordinary skill in the art.

The active circuitry formed on the topside semiconductor surface comprises circuit elements that generally include transistors, diodes, capacitors, and resistors, as well as signal lines and other electrical conductors that interconnect these various circuit elements. Disclosed embodiments can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, disclosed embodiments can be used in a variety of processes including bipolar, CMOS, BiCMOS and MEMS.

EXAMPLES

Disclosed embodiments are further illustrated by the following specific Examples, which should not be construed as limiting the scope or content of this Disclosure in any way.

One exemplary process involves HCD Nitride films used for spacers for the Source/Drain implant (25 to 60 nm wide spacers) in a MOS or BiMOS process. HCD nitride is generally very repeatable and conformal, but also has a high tensile stress (e.g., >+250 MPa). Typically this film is deposited in a batch furnace thereby coating both the wafer topside and bottomside. Therefore, when the spacers are formed by an anisotropic plasma etch, which etches away the majority of the film only on the wafer topside, an upwards facing bowl shape is generally imparted to the wafer topside. When this occurs with a 30 nm spacer, 18 to 20 µm of positive bow has been measured. To compensate for this, a) a compensating tensile film can be deposited on the topside, b) a compensating compressive film can be deposited on the bottomside of the wafer (e.g., 80 to 100 nm amorphous carbon), or c) the HCD tensile film can be removed from the bottomside of the wafer. While all three of these exemplary methods will minimize change in wafer curvature, for ease of integration, solutions utilizing bottomside compensation are generally easier to integrate into a process flow.

Another exemplary process is encountered when the process uses a low partial pressure steam oxidation for shallow trench isolation (STI) Liner, such as a 30 minute 1050° C. $N_2$ anneal for STI fill, a 40 nm HCD nitride spacer deposition, spacer formation plasma etch, 20 KeV Ge $4 \times 10^{14}/cm^2$ pre-amorphization implant, standard source/drain implants followed by a 1275° C. Laser Spike Anneal (LSA). This integration was found to result in a −14 µm bow or an upward facing bowl shape at gate poly pattern and a −40 µm bow at contact pattern. To compensate for this, a 40 nm backside deposition of HCD or BTBAS Nitride can be used to modify the wafer stress state such that bow is approximately −14 µm, so that the wafer curvature at contact pattern matches the wafer curvature at gate poly pattern to improve alignment at the contact pattern due to a significantly decreased range in the depth of focus (e.g., within each stepper shot).

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A method for controlling wafer flatness, comprising:
performing a first lithography step to a topside semiconductor surface of said wafer, wherein said wafer has a reference curvature other than planar during said first lithography step;
after performing the first lithography step, performing at least one process step that results in a changed curvature to said wafer relative to said reference curvature;
after performing the at least one process step, modifying a stress on a bottomside surface of said wafer to provide a modified stress distribution across an area of said bottomside surface of said wafer, wherein said modified stress distribution reduces a difference between said changed curvature and said reference curvature, and
performing a second lithography step to said topside semiconductor surface while said modified stress distribution is present.

2. The method of claim 1, wherein said modifying said stress is exclusive of depositing a film, and wherein said modifying said stress comprises thinning a film existing on said bottomside surface of said wafer prior to said modifying said stress or thinning a thickness of said wafer from said bottomside surface.

3. The method of claim 2, wherein said thinning said film or thinning said thickness modifying comprises non-uniformly thinning.

4. The method of claim 3, wherein said non-uniformly thinning said film comprises backside wet etching, backside plasma etching, or backside chemical mechanical polishing (CMP).

5. The method of claim 1, wherein said modifying said stress comprises depositing at least one film.

6. The method of claim 5, wherein said modifying said stress further comprises non-uniformly thinning said film to form a non-uniform stress distribution across an area of said bottomside surface of said wafer.

7. The method of claim 6, wherein said non-uniformly thinning said film comprises wet etching, backside plasma etching, or chemical mechanical polishing (CMP).

8. The method of claim 6, wherein said non-uniform stress distribution comprises a radial stress distribution that monotonically increases or decreases said stress beginning from a stress minimum or a stress maximum proximate to a center of said wafer.

9. The method of claim 8, wherein said stress on said bottomside surface is at a minimum proximate to a center of said wafer.

10. The method of claim 8, wherein said stress on bottomside surface is at a maximum proximate to said center of said wafer.

11. The method in claim 6, wherein said non-uniform stress distribution comprises a tensile stress distribution.

12. The method in claim 6, wherein said non-uniform stress distribution comprises a compressive stress distribution.

13. The method in claim 1, wherein said method is repeated on said wafer to complete two or more different second lithography steps.

14. The method in claim 1, wherein said first lithography step comprises a gate level and said second lithography step comprises a contact level for contacting said topside semiconductor surface.

15. The method in claim 1, further comprising measuring said reference curvature using a lithography tool used for said first lithography step, storing said reference curvature, and measuring said changed curvature using said alignment tool.

16. A method for controlling wafer flatness, comprising:

performing a first lithography step to a topside semiconductor surface of said wafer, wherein said wafer has a reference curvature other than planar during said first lithography step;

performing at least one process step that results in a changed curvature to said wafer relative to said reference curvature;

modifying a stress on a bottomside surface or said topside semiconductor surface of said wafer to provide a non-uniform stress distribution across an area of said bottomside surface or said topside semiconductor surface, wherein said non-uniform stress distribution reduces a difference between said changed curvature and said reference curvature, and performing a second lithography step to said topside semiconductor surface while said modified stress is present.

17. The method of claim 16, wherein said first lithography step comprises a gate level and said second lithography step comprises a contact level for contacting said topside semiconductor surface.

18. The method of claim 16, wherein said modifying said stress comprises processing applied to said topside semiconductor surface of said wafer.

* * * * *